United States Patent [19]
Fujii et al.

[11] Patent Number: 4,704,774
[45] Date of Patent: Nov. 10, 1987

[54] ULTRASONIC TRANSDUCER AND METHOD OF MANUFACTURING SAME

[75] Inventors: Tadashi Fujii; Hiroyuki Yagami, both of Fujinomiya; Iwao Seo; Masahiro Sasaki, both of Ami, all of Japan

[73] Assignees: Terumo Kabushiki Kaisha; Mitsubishi Petrochemical, both of Tokyo, Japan

[21] Appl. No.: 32,750

[22] Filed: Mar. 31, 1987

Related U.S. Application Data

[62] Division of Ser. No. 815,562, Jan. 2, 1986, abandoned.

[30] Foreign Application Priority Data

Jan. 10, 1985 [JP] Japan .................................. 60-1402

[51] Int. Cl.$^4$ ............................................. H01L 41/22
[52] U.S. Cl. .................... 29/25.35; 310/800; 310/335
[58] Field of Search ............... 29/25.35; 310/800, 334, 310/335, 348, 366, 320, 357–359

[56] References Cited

U.S. PATENT DOCUMENTS

| | | | |
|---|---|---|---|
| 3,365,593 | 1/1968 | Roof et al. | 310/800 X |
| 3,935,485 | 1/1976 | Yoshida et al. | 310/800 X |
| 3,940,637 | 2/1976 | Ohigashi et al. | 310/800 X |
| 4,071,785 | 1/1978 | Yoshida et al. | 310/800 X |
| 4,216,403 | 8/1980 | Krempl et al. | 310/800 X |
| 4,234,813 | 11/1980 | Iguchi | 310/800 X |
| 4,315,433 | 2/1982 | Edelman et al. | 310/800 X |
| 4,424,465 | 1/1984 | Ohigashi et al. | 310/800 X |
| 4,433,400 | 2/1984 | De Reggi et al. | 310/800 X |

*Primary Examiner*—Carl E. Hall
*Attorney, Agent, or Firm*—Frishauf, Holtz, Goodman & Woodward

[57] ABSTRACT

An ultrasonic transducer includes a plate-shaped piezoelectric body made of a piezoelectric polymer material and having a polarized portion obtained by polarizing a prescribed region thereof, as well as first and second unpolarized portions contiguous to the polarized portion. A first electrode is formed on one main surface of the piezoelectric body to cover the polarized portion and has an edge portion extending over the first unpolarized portion. A second electrode is formed on the other main surface of the piezoelectric body to cover the polarized portion and has an edge portion extending over the second unpolarized portion. A first conductive lead is electrically connected to the edge portion of the first electrode, and a second conductive lead is electrically connected to the edge portion of the second electrode.

3 Claims, 18 Drawing Figures

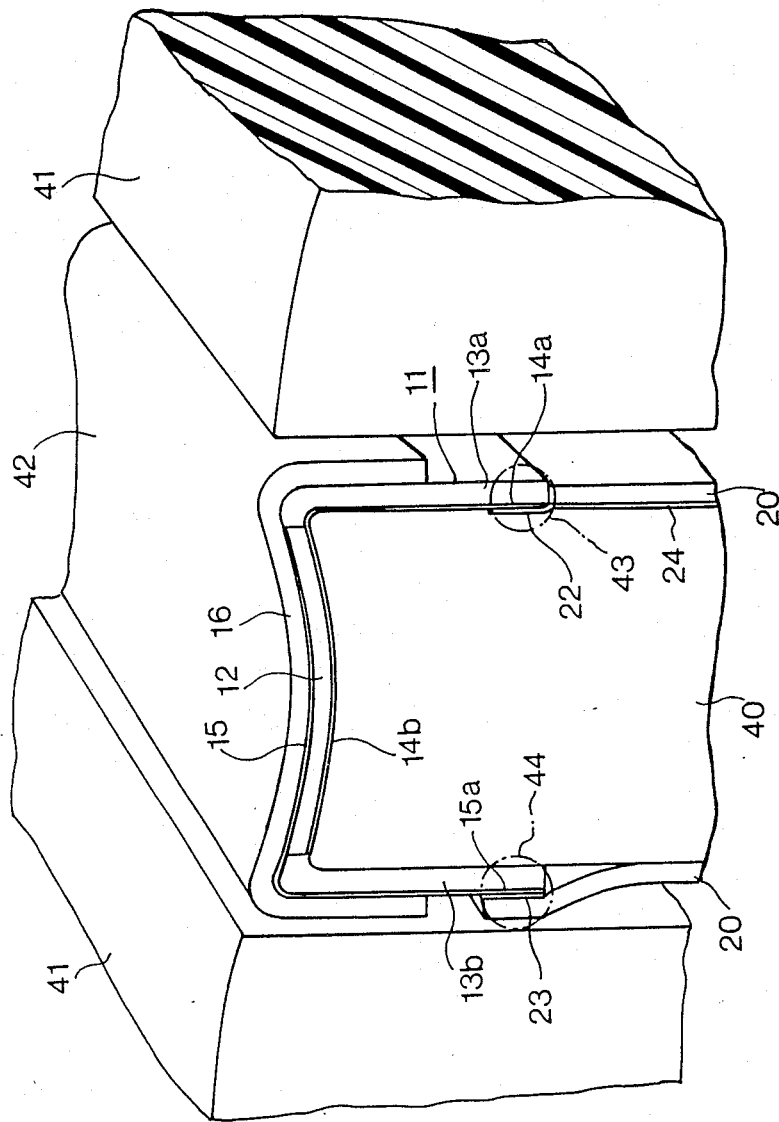

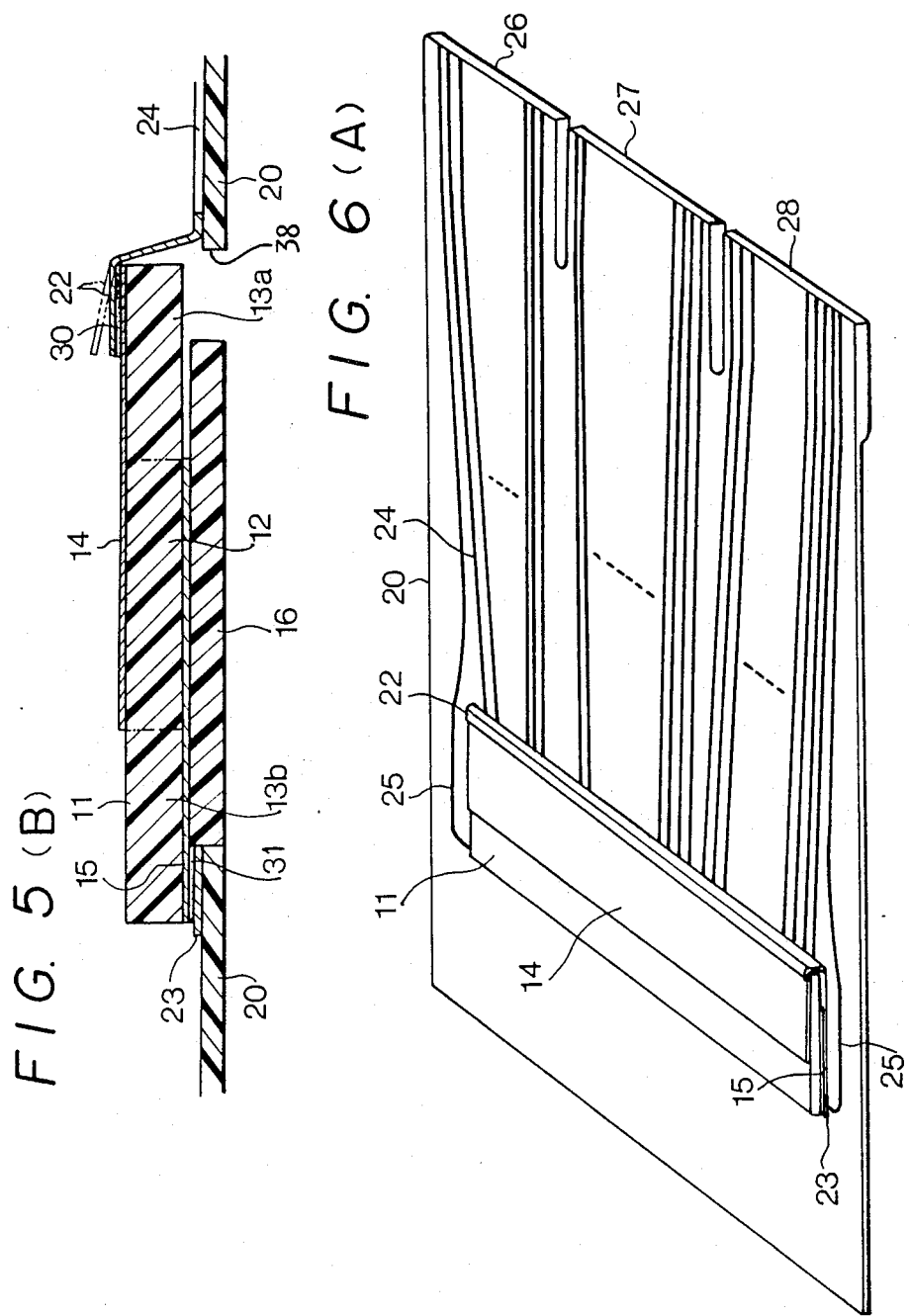

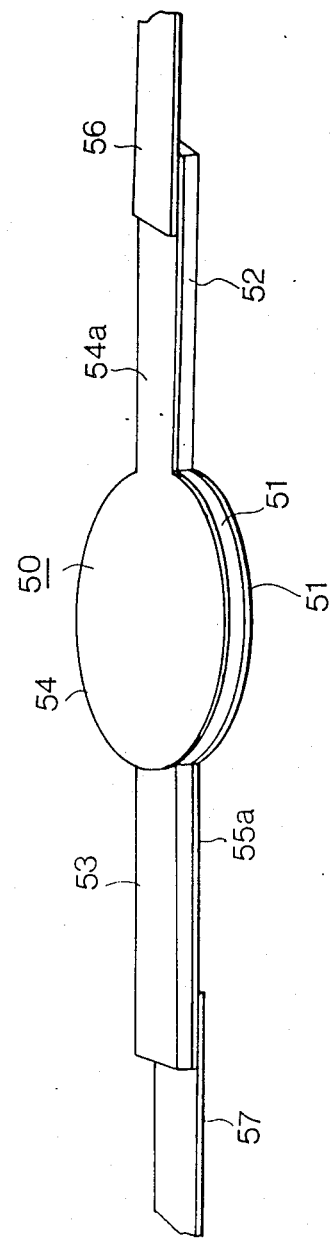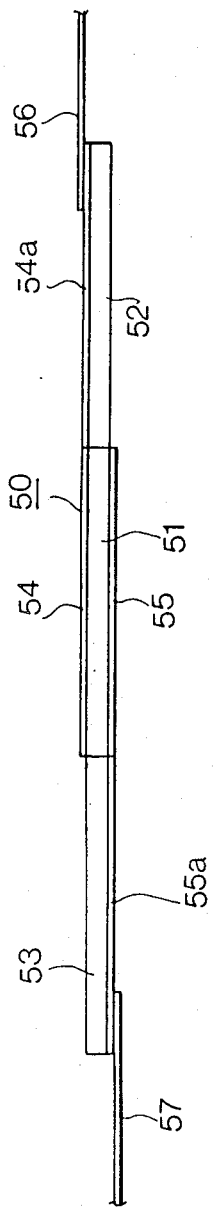
FIG. 8(A)
FIG. 8(B)

ULTRASONIC TRANSDUCER AND METHOD OF MANUFACTURING SAME

This is a division of application Ser. No. 815,562, filed Jan. 2, 1986, now abandoned.

BACKGROUND OF THE INVENTION

1. Field of the Invention

This invention relates to an ultrasonic transducer and to a method of manufacturing the same.

2. Description of the Prior Art

Ultrasonic transducers are widely employed as the probes in ultrasound diagnostic equipment for real-time observation of the tomograph of a living body, in ultrasound materials testing equipment for the non-destructive testing of materials, and in many other applications.

Various materials capable of being used as a vibrator in such ultrasonic transducers have been the object of research. One material recently proposed for such use is a piezoelectric polymer material such as polyvinylidene fluoride (PVDF) or a composite of a ferro-electric ceramic powder and a polymer. The reason for this is that a piezoelectric polymer material exhibits excellent acoustic matching with respect to a living body since its acoustic impedence is closer to that of a living body than is the acoustic impedance of conventional ceramic materials. Such a piezoelectric polymer material also has a low mechanical Q, as a result of which improved sensitivity and response are anticipated, and exhibits flexibility that enables the vibrator to be machined into almost any shape with comparative ease. Another reason for using a piezoelectric polymer material is its high anisotropy. Specifically, the vibrating efficiency of such a material in the direction of its thickness is considerably higher than in a direction perpendicular thereto, namely the transverse direction, so that the material can be formed into a vibrator approximating an ideal piston acoustic source. Since the thickness of such a vibrator can be made very small, application in the high-frequency region is widespread.

However, certain problems are encountered when attempting to employ a piezoelectric polymer material to construct a linear or sector-type array of transducers for high-frequency use. Specifically, it is necessary to make the spacing between adjacent elements of the array very small in the width direction of the elements in order to minimize the grating lobe. Since a piezoelectric polymer material constitutes a vibrator approximating a piston acoustic source, as mentioned above, the method most widely adopted to form the array elements is to form only the electrodes into an array pattern, as opposed to the method used with conventional ceramic elements where the elements are formed by cutting them individually with a diamond cutter or the like. In other words, with a piezoelectric polymer material, the array pattern electrodes are formed by a technique such as photoetching, screen printing or vapor deposition. However, when the array element spacing is further reduced for the purpose of minimizing the grating lobe, it is sometimes difficult to form array pattern electrodes which are stable in terms of shape by using the foregoing method. This can lead to a deterioration in acoustic characteristics.

SUMMARY OF THE INVENTION

A first object of the present invention is to provide an ultrasonic transducer having excellent acoustic characteristics in the high-frequency region with use of a piezoelectric polymer material.

A second object of the present invention is to provide a method of manufacturing such an ultrasonic transducer.

According to the present invention, the first object is attained by providing an ultrasonic transducer comprising: a plate-shaped piezoelectric body made of a piezoelectric polymer material and having a polarized portion obtained by polarizing a prescribed region thereof, an unpolarized portion contiguous to the polarized portion, and opposing first and second main surfaces; a first electrode means formed on the first main surface of the piezoelectric body to cover the polarized portion and having an edge portion extending over the unpolarized portion; a second electrode means formed on the second main surface of the piezoelectric body to cover the polarized portion and having an edge portion extending over the unpolarized portion; a first conductive lead means electrically connected to the edge portion of the first electrode means; and a second conductive lead means electrically connected to the edge portion of the second electrode means.

According to an embodiment of the present invention, the first electrode means comprises a plurality of electrodes arranged in a side-by-side array having a prescribed inter-electrode spacing, the first conductive lead means comprises a plurality of conductors the number which is identical with the number of electrodes of the first electrode means, and the second electrode means comprises a single common electrode opposing the first electrode means. In another embodiment of the invention, the unpolarized portion of the piezoelectric body has first and second regions situated on a plane different from that of the polarized portion, and the edge portions of the first and second electrode means are situated on the first and second regions, respectively.

According to the present invention, the second object is attained by providing a method of manufacturing an ultrasonic transducer comprising steps of: forming a polarized portion and an unpolarized portion at prescribed regions of a plate-shaped piezoelectric body made of a piezoelectric polymer material having opposing first and second main surfaces by bringing first and second electrical conductors into intimate contact with the first and second main surfaces, respectively, and applying a voltage at least across the first and second electrical conductors; depositing a first electrode on the first main surface to cover the polarized portion and to extend over a region of the unpolarized portion, and a second electrode on the second main surface to cover the polarized portion and to extend over a region of the unpolarized portion, the first and second electrodes each comprising an electrical conductor; depositing first and second electrically conductive leads on a main surface of a flexible substrate; bonding an end portion of the first electrically conductive lead to the first electrode at an edge portion thereof extended over the region of the unpolarized portion, and an end portion of the second electrically conductive lead to the second electrode at an edge portion thereof extended over the region of the unpolarized portion; and effecting bonding to a backing member with the polarized portion situated on an upper surface of the backing member and the edge portions of the first and second electrodes situated on first and second side faces, respectively, of the backing member.

According to the present invention, the second object may also be attained by providing a method of manufacturing an ultrasonic transducer comprising steps of: forming a polarized portion and an unpolarized portion at prescribed regions of a plate-shaped piezoelectric body consisting of a piezoelectric polymer material having opposing first and second main surfaces by bringing first and second electrical conductors into intimate contact with the first and second main surfaces, respectively, and applying a voltage at least across the first and second electrical conductors; depositing a first electrode on the first main surface to cover the polarized portion and to extend over the region of the unpolarized portion, and a second electrode on the second main surface to cover the polarized portion and to extend over the region of the unpolarized portion, the first and second electrodes each comprising an electrical conductor; depositing first and second electrically conductive leads on a main surface of a flexible substrate, the first electrically conductive lead each consisting of a plurality of electrically conductive patterns connected commonly at a first end thereof and having a second end branching outwardly from the commonly connected first end; bonding the first electrically conductive lead to the first electrode at an edge portion thereof extended over the region of the unpolarized portion and the second electrically conductive leads to the second electrode at an edge portion thereof extended over the region of the unpolarized portion; cutting the first electrode and the edge portion thereof having the second electrically conductive leads bonded thereto into an array configuration having a prescribed spacing; and effecting bonding to a backing member with the polarized portion situated on an upper surface of the backing member and the edge portions of the first and second electrodes situated on first and second side faces, respectively, of the backing member.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 8(A) and 8(B) are perspective and front views respectively illustrating another embodiment of an ultrasonic transducer according to the present invention.

DESCRIPTION OF THE PREFERRED EMBODIMENT

Figure 1:
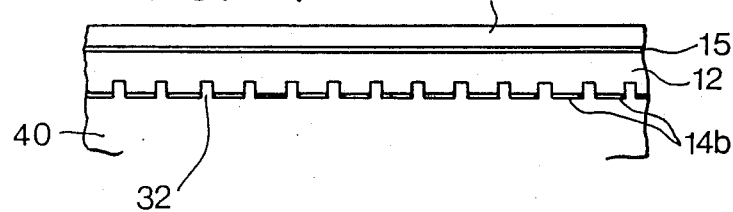
FIG. 1(A) is a perspective view, partially in section, illustrating an embodiment of an ultrasonic transducer according to the present invention.
FIG. 1(B) is an enlarged view of a principal portion of the ultrasonic transducer shown in FIG. 1(A)
Figure 2:
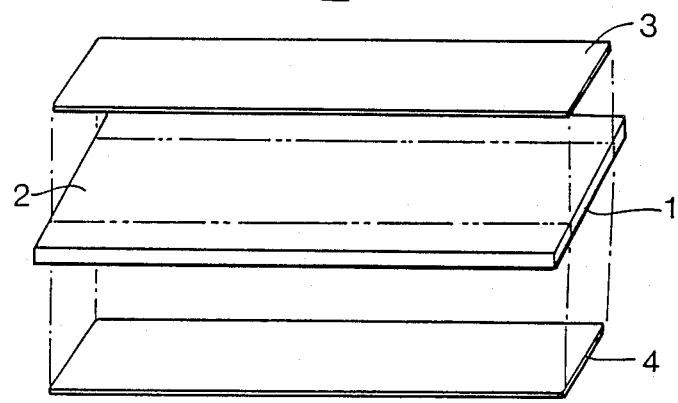
FIGS. 2 through 7 are views for describing a method of manufacturing the ultrasonic transducer of FIG. 1 in accordance with an embodiment of the present invention.
Figure 2:
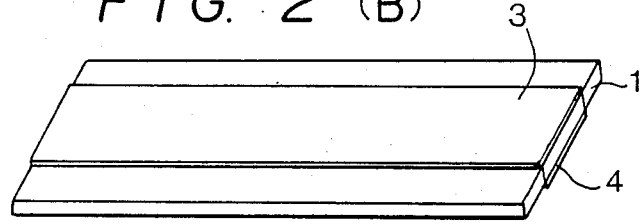
Figure 2:
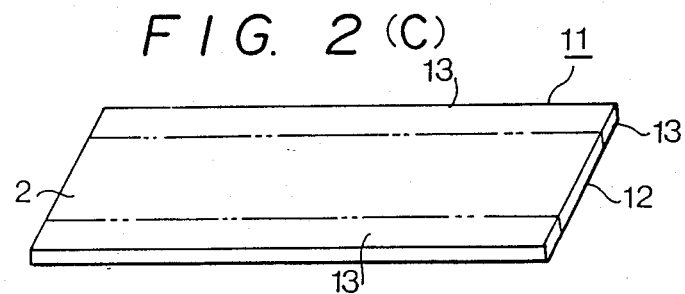

An ultrasonic transducer according to the present invention and a method of manufacturing the same in accordance with the invention will now be described with reference to the accompanying drawings.

An embodiment of an ultrasonic transducer according to the present invention and illustrated in FIGS. 1(A) and 1(B) will be described in line with a process, shown in FIGS. 2 through 7, for manufacturing the same.

FIGS. 2(A)–2(C) illustrate a procedure in which a piezoelectric polymer material is used to form a piezoelectric body (or member) a prescribed region of which has a polarized portion. The piezoelectric polymer material consists of polyvinyl fluoride, polyvinylidene fluoride, vinylidene fluoride - vinyl fluoride copolymer, vinylidene fluoride - ethylene trifluoride copolymer, vinylidene fluoride - ethylene tetrafluoride copolymer, vinylidene cyanide - vinyl acetate copolymer, vinylidene cyanide - acrylnitrile copolymer, vinylidene cyanide - vinylidene chloride copolymer, vinylidene cyanide - styrene copolymer, vinylidene cyanide - methyl methacrylate copolymer, vinylidene cyanide - methyl chloro acrylate copolymer, vinylidene cyanide - vinyl benzonate copolymer, vinylidene cyanide - vinyl chloro acetate copolymer, vinylidene cyanide - vinyl chloride copopymer, vinylidene cyanide - acryl acid copolymer, vinylidene cyanide - 2.5-di chloro styrene copolymer, vinylidene cyanide - 2 chloro-1.3-butadiene copolymer, polyvinylidene cyanide, polyacrylnitrile, polyvinyl chloride and the like in molded form, a uniaxially or biaxially stretched material. The piezoelectric polymer material may also consist of a composite obtained by kneading finely divided powder of a ferro-electric ceramic such as lead titanate or lead zirconate titanate with a polymeric material such as polyvinylidene fluoride, polyvinyl fluoride, nylon, polyacetal or polyacrylnitrile.

As shown in FIG. 2(A), a polymeric piezoelectric member 1 has a prescribed region 2 which is to be subjected to a polarization treatment. Electrically conductive plates 3, 4 made of copper or the like and shaped to correspond to the region 2 are brought into intimate abutting contact with the upper and lower main surfaces, respectively, of the piezoelectric member 1 so as to cover the region 2, as shown in FIG. 2(B). The prescribed region 2 of the piezoelectric member 1 is then polarized by applying a voltage across the conductive plates 3, 4, after which the plates 3, 4 are removed. Though the polarizing conditions will differ depending upon the type of piezoelectric member, the temperature range is 10° to 180° C., preferably 40° to 175° C., the electric field strength ranges from 50 kV/cm up to the dielectric breakdown strength, preferably 100 to 2000 kV/cm, and the voltage is applied from 10 sec to 10 hr, preferably from 10 min to 2 hr.

Thus, as shown in FIG. 2(C), there is formed a piezoelectric body 11 having a polarized portion 12 located at the central portion of the piezoelectric body and extending along its major axis, as well as an unpolarized portion 13 along each longitudinal side edge of the piezoelectric body.

Figure 3:
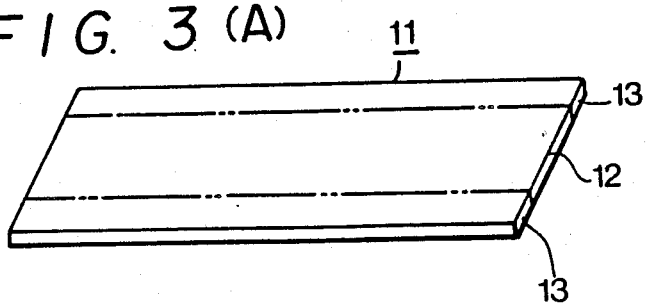
Figure 3:
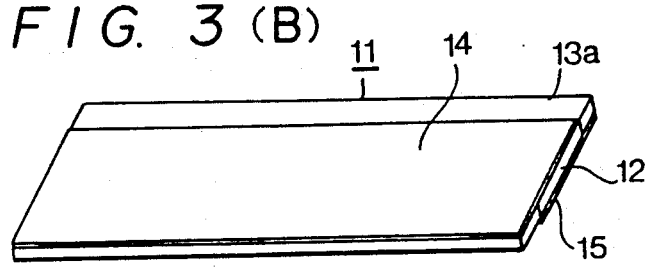
Figure 3:
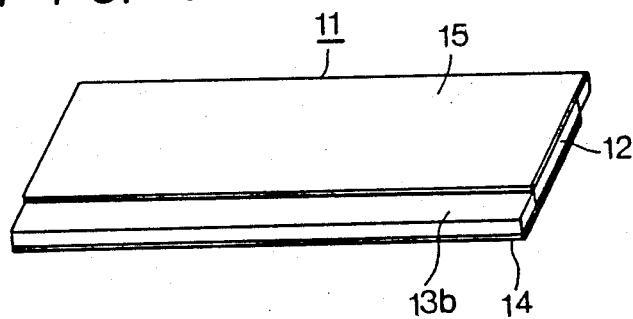
Figure 3:
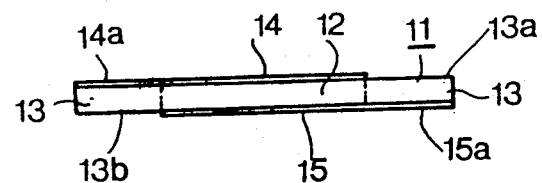
Figure 4:
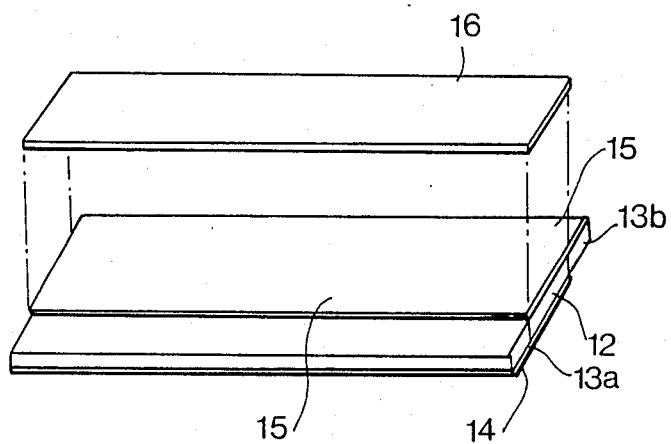
Figure 4:
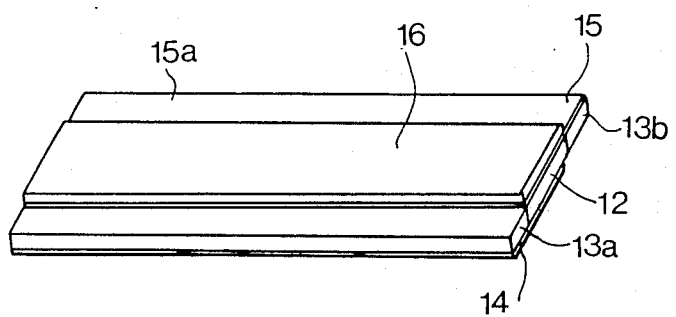
Figure 5:
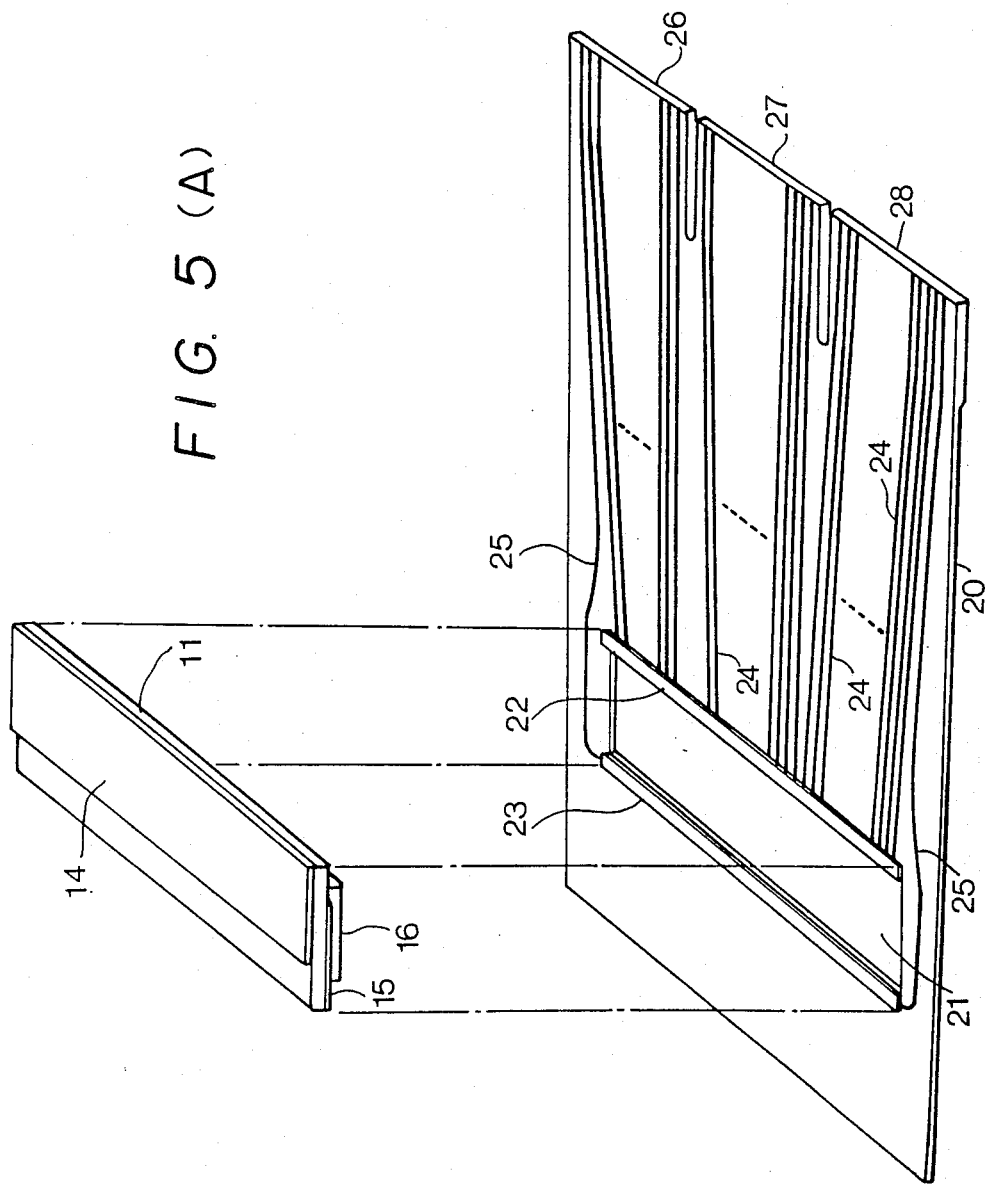
Figure 6:
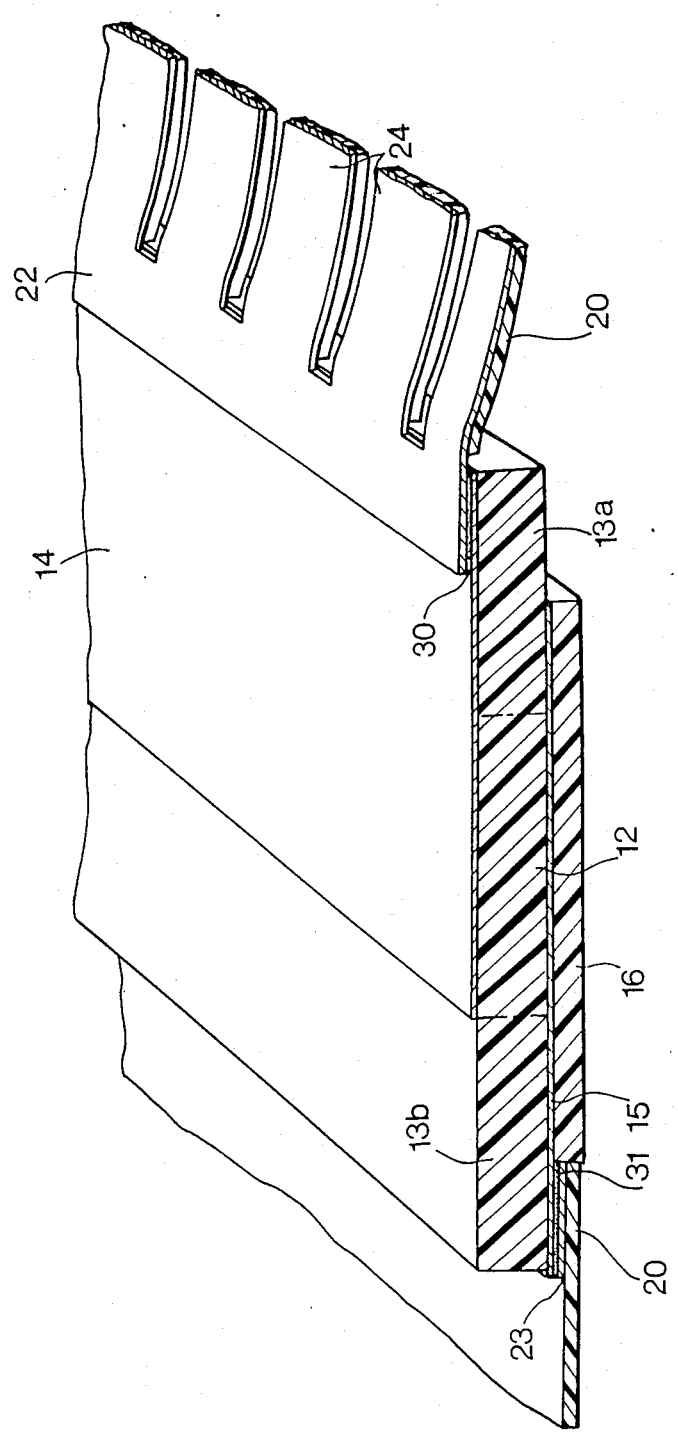

FIGS. 3(A)–3(D) are views illustrating a procedure for forming electrodes on the partially polarized piezoelectric body 11. FIG. 3(A) depicts the piezoelectric body 11 having the polarized portion 12 formed as described above. As shown in (B) and (C) of FIG. 3, an electrically conductive material for forming first and second electrodes 14, 15 is deposited on the first [FIG. 3(B)] and second [FIG. 3(C)] main surfaces, respectively, of the piezoelectric body 11 by a known method such as vacuum deposition, sputtering or screen printing. The first electrode 14 is formed on the first main surface to cover only one of the unpolarized portions 13, leaving the other unpolarized portion 13 exposed, as indicated at numeral 13a. Likewise, the second electrode 15 is formed on the second main surface to cover only the unpolarized portion 13 thereof corresponding to the exposed unpolarized portion 13a. The unpolarized portion 13 left exposed is indicated at numeral 13b. Thus, as illustrated in the sectional view of FIG. 3(D), the resulting piezoelectric body 11 has the unpolarized portions 13 on both sides of the polarized portion 12 and contiguous thereto, the main portion of the first electrode 14 located on that portion of the first main surface corresponding to the polarized portion 12, the second electrode 15 located on that portion of the second main surface corresponding to the polarized portion 12, a connective edge portion 14a of the first electrode 14 extending over the unpolarized portion 13b on the first main surface, and a connective edge portion 15a of the second electrode 15 extending over the unpolarized portion 13a on the second main surface. As shown in FIGS. 4(A) and 4(B), an acoustic matching layer 16 is so deposited on the second surface of the piezoelectric body 11 having the second electrode 15 as to cover the region constituted by the polarized portion 12. The acoustic matching layer 16 also functions to protect the acoustic radiation surface of the piezoelectric body 11 including the second electrode 15 and consists of a flexible film of polyester or polyimide of low acoustic impedance deposited on the second surface by bonding or, preferably, by thermal fusion.

The next step of the method of manufacture is to form conductive leads on a flexible substrate, as shown in FIGS. 5(A) and 5(B), to enable external connection. Specifically, a substrate 20 comprising a flexible insulator such as polyimide or polyester is formed to include an opening 21. The width of the opening 21 is equivalent to that of the piezoelectric body 11 minus the connective edge portions 14a, 15a, and its length is approximately the same as that of the piezoelectric body 11 along the major axis thereof. Arranged on the surface of substrate 20 in contact with the longitudinal side edges of the opening 21 are first and second conductive lead edge portions 22, 23 corresponding to the connective edge portions 14a, 15a and of the same width. A plurality of first conductive leads 24 extend along the surface of the substrate 20 from the conductive lead edge portion 22 to one side edge of the substrate 20, and a pair of second conductive leads 25 extend along the surface of the substrate 20 from the conductive lead edge portion 23 to the side edge of the substrate 20. The distal end portions of the leads 24, 25 form terminal portions 26, 27, 28 at the side edge of the substrate 20 so that a connection can be made to external circuitry, not shown. These conductive lead patterns are formed by being deposited using a method such a vapor deposition or photoetching. The number of conductive lead patterns constituting the first conductive leads 24 is equal to the number of elements in the array.

FIG. 5(B) is a view illustrating the manner in which the piezoelectric body 11 including the electrodes 14, 15 has been inserted into the opening 21. As shown in FIG. 5(A), the leads 24 and 25 are extended on the same surface of the substrate 20, while the electrodes 14 and 15 are deposited on the opposing surfaces of the piezoelectric body 11 respectively. Accordingly, as shown in FIG. 5(B), it is necessary that the conductive lead edge portion 22 which is to be bonded to the connective edge portion 14a, is extended beyond over an edge 38 of the substrate 20, in advance. On the other hand, if the leads 24, 25 are deposited on opposing surfaces of the substrate 20, respectively, it is not necessary for the conductive lead edge portion 22 to be extended over the edge 38.

As shown in FIGS. 6(A), 6(B), the piezoelectric body 11 is inserted into the opening 21 of substrate 20, and the edge portions 14a, 15a of the first and second electrodes 14, 15 are respectively bonded to the first and second conductive lead edge portions 22, 23 via adhesive layers 30, 31 consisting of an electrically conductive adhesive. FIG. 6(B) is an enlarged view of the bonded portions.

Figure 7:
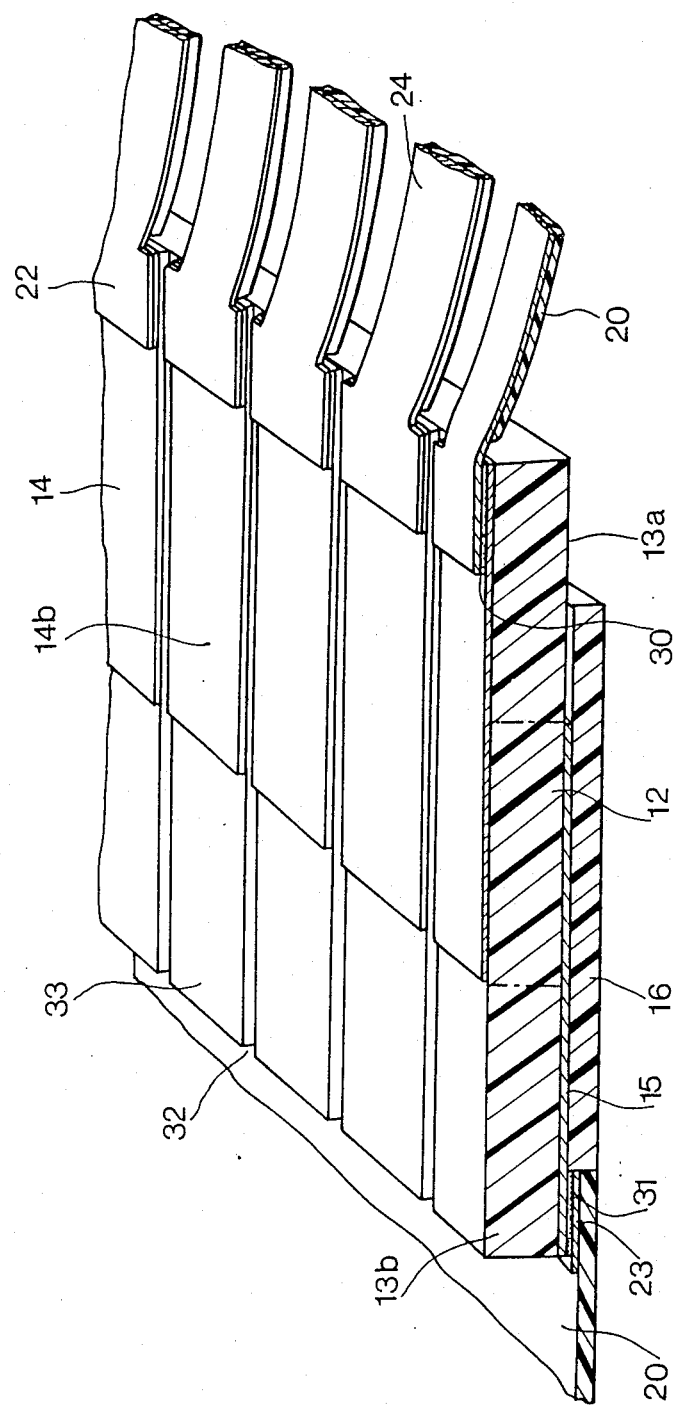

Next, the first electrode 14 is divided into a plurality of electrodes constituting an electrode array. This is accomplished, as shown in FIG. 7, by using a dicing saw or the like to simultaneously cut the conductive lead edge portion 22 and first electrode 14 into segments coinciding with respective ones of the conductive leads 24 formed on the substrate 20 at locations corresponding to the array elements. The cutting operation forms grooves 32 only so deep as to reach the bottom surface of the first electrode 14. Thus, the first electrode 14 is partitioned into an array of plural electrodes 14b arranged side by side with a very small inter-electrode spacing, and each electrode 14b is reliably connected to its corresponding conductive lead 24. The result is a plurality of array elements 33. The piezoelectric element so obtained comprises the array elements 33 formed and arranged in a highly precise manner.

As shown in FIG. 1(A), the piezoelectric element of FIG. 7 is bonded to a backing 40, which consists of a material such as epoxy resin, to form a linear array transducer. The piezoelectric transducer is bonded to the backing 40 in such a manner that the polarized portion 12 is disposed on the upper edge surface of the backing, with the surface of the polarized portion having the second electrode 15 deposited thereon being faced upward. The second electrode 15, it should be noted, serves as a common electrode. By exploiting their flexibility, the piezoelectric body 11 and substrate 20 are bent and then bonded to the backing 40 in such a manner that the joints between the first and second electrode edge portions 14a, 15a and the first and second conductive lead edge portions 22, 23, respectively, are positioned at the sides of the backing 40. In the Figure, numeral 41 denotes a case, and 42 represents an effective acoustic radiation surface.

Thus, in accordance with the ultrasonic transducer of the illustrated embodiment, only the portion of the piezoelectric member at the region corresponding to the effective acoustic radiation surface 42 is polarized, the junctions between the electrodes 14, 15 and the conductive leads 24, 25 (which portions are encircled by the phantom lines 43, 44 in FIG. 1) are situated on the unpolarized portions 13a, 13b, and the junctions 43, 44 are situated on the sides of the backing 40 remote from the acoustic radiation surface 42. Such an arrangement eliminates the adverse influence of the junctions 43, 44, which act as unnecessary acoustic interfaces. In other words, only the very thin second electrode 15 formed as by vacuum deposition and acoustic matching layer 16 formed as by thermal fusion are present at the effective acoustic radiation surface 42, and other harmful interfaces are located at positions remote from the effective acoustic radiation surface 42. This has the effect of enhancing the acoustic characteristics. In particular, excellent high-frequency acoustic characteristics are obtained since the slight influence of the adhesive layers 30, 31 and first and second conductive lead edge portions 22, 23 at the junctions 43, 44 is eliminated.

Further, as shown in FIG. 1(A), the upper end face of the backing 40d is recessed by exploiting the flexibility of the piezoelectric body 11. This has the effect of focusing sound waves in a direction perpendicular to the ultrasonic scanning direction.

According to the method of manufacture of the illustrated embodiment, the ultrasonic transducer having the foregoing construction can be formed in a very simple manner. In particular, since the method of the invention includes polarizing solely the prescribed region of the piezoelectric polymer member, subsequently depositing the first and second electrodes which correspond to the common electrode and array electrodes covering the polarized portion and having edge portions situated at the unpolarized portions, thereafter connecting these first and second electrode edge portions to the conductive lead edge portions formed on the flexible substrate, and then cutting the first electrode and the corresponding conductive lead edge portion simultaneously by a dicing saw to form array electrodes, a highly dense array of elements can be formed with great precision and stability. The result is a high-density array-type ultrasonic transducer particularly well-suited for application in the high-frequency region.

Moreover, since the array electrodes of the piezoelectric member are formed and the array electrodes are essentially electrically connected to external circuitry all through a simple process of manufacture, the overall process is curtailed. In addition, since the piezoelectric member is cut only to the depth of the array electrode portion, the piezoelectric material exhibits a high mechanical strength. The result is a stable ultrasonic transducer having a high degree of strength where the piezoelectric body is bonded to the acoustic matching layer and backing.

Since the overall piezoelectric element exhibits flexibility, it can be freely deformed into a desired configuration. Thus, the transducer is applicable not only to linear array probes but can be converted into probes of the arc array and convex array type. Accordingly, the ultrasonic transducer can be widely applied to various methods of ultrasound tomography and to the diagnosis of various regions of a living body.

The present invention can also be applied to an ultrasonic transducer for a unit probe of the type shown in FIGS. 8(A), 8(B). A piezoelectric body 50 comprising a piezoelectric polymer member has a disk-shaped polarized portion 51 and linear unpolarized portions 52, 53 extending from the periphery of the polarized portion 51. A first electrode 54 is deposited on the polarized portion 51 and unpolarized portion 52 so as to cover their upper surface. Likewise, a second electrode 55 is deposited on the polarized portion 51 and unpolarized portion 53 so as to cover their lower surface. The first electrode 54 has an end portion 54a situated at the end of the unpolarized portion 52, and the second electrode 55 has an end portion 55a situated at the end of the unpolarized portion 53. First and second conductive leads 56, 57 are formed so as to be connected to the first and second electrode end portions 54a, 55a, respectively. The effects obtained are similar to those of the embodiment of FIG. 1.

ADVANTAGES OF THE INVENTION

Thus, in accordance with the ultrasonic transducer of the present invention, only the portion of the piezoelectric member at the region corresponding to the acoustic radiation surface is polarized, the junctions between the electrodes and the conductive leads are situated on the unpolarized portions, and the junctions are situated at locations remote from the acoustic radiation surface. As a result, the junctions, which act as unnecessary acoustic interfaces, have no adverse influence upon the effective acoustic radiation surface so that the acoustic characteristics in the high-frequency region can be improved.

Further, the method of manufacture of the present invention includes polarizing solely the prescribed region of the piezoelectric polymer member, subsequently depositing the first and second electrodes covering the polarized portion and having edge portions situated on the unpolarized portions, thereafter connecting these first and second electrode edge portions to the conductive lead edge portions formed on the flexible substrate, and then cutting the first electrode and the junction between the first electrode and conductive lead portion at the same time to form array electrodes. Accordingly, the manufacturing method of the present invention makes it possible to form a highly dense array of elements with great precision and stability.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing an ultrasonic transducer comprising steps of:

forming a polarized portion at a prescribed region of a plate-shaped piezoelectric body consisting of a piezoelectric polymer material, having opposing first and second main surfaces by bringing first and second electrical conductors into intimate contact with the first and second main surfaces, respectively, and applying a voltage at least across the first and second electrical conductors, thus also forming a unpolarized portion contiguous to the polarized portion;

depositing a first electrode on the first main surface to cover the polarized portion and to extend over a first region of the unpolarized portion, and a second electrode on the second main surface to cover the polarized portion and to extend over a second region of the unpolarized portion, said first and second electrodes each comprising an electrical conductor;

depositing a first electrically conductive lead on either of two opposing main surfaces of a flexible substrate, and a second electrically conductive lead on either of said two opposing main surfaces of the flexible substrate;

bonding an end portion of said first electrically conductive lead to said first electrode at an edge portion thereof extended over said first region of the unpolarized portion polarized portion, and an end portion of said second electrically conductive lead to said second electrode at an edge portion thereof extended over the second region of the unpolarized portion; and effecting bonding to a backing member at least one surface of which is plate-shaped, with the polarized portion being situated on said plate-shaped surface of the backing member and the edge portions of said first and second electrodes being situated on first and second side surfaces, respectively, of the backing member.

2. A method of manufacturing an ultrasonic transducer comprising steps of:

forming a polarized portion at a prescribed region of a plate-shaped piezoelectric body consisting of a piezoelectric polymer material, having opposing first and second main surfaces by bringing first and second electrical conductors into intimate contact with the first and second main surfaces, respectively, and applying a voltage at least across the first and second electrical conductors, thus also forming a unpolarized portion contiguous to the polarized portion;

depositing a first electrode on the first main surface to cover the polarized portion and to extend over a first region of the unpolarized portion, and a second electrode on the second main surface to cover the polarized portion and to extend over a second region of the unpolarized portion, said first and second electrodes each comprising an electrical conductor;

depositing a first electrically conductive lead on either of two opposing main surfaces of a flexible substrate, and a second electrically conductive lead on either of said two opposing main surfaces of the flexible substrate;

cutting said first electrode and the edge portion thereof having said second electrically conductive leads bonded thereto into an array configuration having a prescribed spacing; and effecting bonding to a backing member at least one surface of which is plate-shaped, with the polarized portion being situated on said plate-shaped surface of the backing member and the edge portions of said first and second electrodes being situated on first and second side surfaces, respectively, of the backing member.

3. The method according to claim 2, wherein said step of depositing the first and second electrically conductive leads includes providing the substrate with an opening of a shape substantially the same as that of the main surfaces of the piezoelectric body, and providing said first and second conductive leads on outer edges of said opening, and said step of bonding end portions of said first and second electrically conductive leads, respectively, includes inserting the piezoelectric body having said first and second electrodes deposited thereon into said opening in such a manner that the end portions of said first and second electrically conductive leads contact the edge portions of said first and second electrodes, respectively.

* * * * *

UNITED STATES PATENT AND TRADEMARK OFFICE
CERTIFICATE OF CORRECTION

PATENT NO. : 4,704,774
DATED : November 10, 1987
INVENTOR(S) : Tadashi FUJII; Hiroyuki YAGAMI It is certified that error appears in the above-identified patent and that said Letters Patent is hereby corrected as shown below:

The title should be --METHOD OF MANUFACTURING AN ULTRASONIC TRANSDUCER--.

Add following references under U.S. PATENT DOCUMENTS:
--4,385,255  5/1983  Yamaguchi et al......29/25.35 X--
--4,404,489  9/1983  Larson, III et al....29/25.35 X--

Column 3, line 6, "consisting" should be --made--.

Column 6, line 49, "...FIG.1) should be --FIG.1(A)--.

Column 6, line 67, "40d" should be --40--.

Column 9, Claim 2, line 23, add following paragraph after the word "substrate":

--bonding an end portion of said first electrically conductive lead to said first electrode at an edge portion thereof extended over said first region of the unpolarized portion polarized portion, and an end portion of said second electrically conductive lead to said second electrode at an edge portion thereof extended over the second region of the unpolarized portion;--.

UNITED STATES PATENT AND TRADEMARK OFFICE
CERTIFICATE OF CORRECTION

PATENT NO. : 4,704,774

DATED : November 10, 1987

INVENTOR(S) : Tadashi FUJII; Hiroyuki YAGAMI

It is certified that error appears in the above-identified patent and that said Letters Patent is hereby corrected as shown below:

Column 10, Claim 2, line 1, "leads" should be --lead--.

Signed and Sealed this

Sixth Day of September, 1988

Attest:

DONALD J. QUIGG

*Attesting Officer*  *Commissioner of Patents and Trademarks*